United States Patent
Li et al.

(10) Patent No.: US 9,036,382 B2
(45) Date of Patent: May 19, 2015

(54) METHOD AND APPARATUS FOR RIPPLE AND PHASE LOSS DETECTION

(71) Applicants: Bing Li, Singapore (SG); David Leggate, New Berlin, WI (US); Timothy Rowan, Wauwatosa, WI (US)

(72) Inventors: Bing Li, Singapore (SG); David Leggate, New Berlin, WI (US); Timothy Rowan, Wauwatosa, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 192 days.

(21) Appl. No.: 13/787,291

(22) Filed: Mar. 6, 2013

(65) Prior Publication Data

US 2014/0254217 A1 Sep. 11, 2014

(51) Int. Cl.
*H02H 7/10* (2006.01)
*G01R 21/06* (2006.01)
*H02M 5/458* (2006.01)
*H02M 1/14* (2006.01)

(52) U.S. Cl.
CPC ............. *G01R 21/06* (2013.01); *H02M 5/4585* (2013.01); *H02M 1/14* (2013.01)

(58) Field of Classification Search
USPC ........... 361/85–87, 90, 91.1, 111; 363/34, 35, 363/37, 39, 45, 46, 47, 50
See application file for complete search history.

(56) References Cited

U.S. PATENT DOCUMENTS

| 7,355,866 B2 | 4/2008 | Hsieh et al. |
| 7,480,124 B2 | 1/2009 | Pankau et al. |
| 2006/0268587 A1* | 11/2006 | Veenstra ......................... 363/37 |
| 2013/0010505 A1* | 1/2013 | Bo et al. ......................... 363/37 |

OTHER PUBLICATIONS

Rodriguez, Pedro et al. literature titled "Multiple Second Order Generalized Integrators for Harmonic Synchronization of Power Converters", IEEE, 978-1-4244-2893, pp. 2239-2245, 2009.
Rodriguez, Pedro et al. literature titled "Grid Synchronization of Power Converters using Multiple Second Order Generalized Integrators", IEEE, 978-1-4244-1766, pp. 755-760, 2008.
Rodriguez, Pedro et al. literature titled "Multiresonant Frequency-Locked Loop for Grid Synchronization of Power Converters Under Grid Conditions", IEEE Transactions on Industrial Electronics, vol. 58, No. 1, pp. 127-138, Jan. 2011.

* cited by examiner

*Primary Examiner* — Nguyen Tran
(74) *Attorney, Agent, or Firm* — Fay Sharpe LLP (57) ABSTRACT

Methods and apparatus are presented for detecting phase loss and/or excessive ripple in a power converter, in which bandpass filters are used to obtain harmonic voltage amplitudes associated with the power converter DC bus, and phase loss is detected if a ratio of the second harmonic to the sixth harmonic and/or a ratio of the fourth harmonic to the sixth harmonic exceed predetermined threshold values.

19 Claims, 5 Drawing Sheets

METHOD AND APPARATUS FOR RIPPLE AND PHASE LOSS DETECTION

BACKGROUND

Power conversion systems are used to generate and provide AC output power to a load, such as a single or multi-phase AC motor driven by an inverter stage of a motor drive power converter. The power converter typically receives AC input power from a three-phase supply, and an input rectifier provides a DC bus voltage from which the inverter generates AC output signals to drive the load. In voltage source converters, the DC bus or DC link includes one or more capacitors, which are often electrolytic capacitors. However, excessive ripple voltage on the DC bus increases ripple current flowing in the bus capacitor(s), which can stress electrolytic capacitors, potentially leading to overheating and shortening of capacitor operational lifetime. Early detection of excessive DC bus ripple voltage can be used to provide an alarm or safely shutdown the power converter prior to bus capacitor damage or stress. However, many ripple detection approaches involve additional circuitry or are computationally intensive, adding cost and complexity to the system. Another problem in power conversion systems is loss of an AC input phase, which can increase DC bus ripple voltage and reduce the DC voltage supplied to the inverter. Accordingly, detection of input phase loss can also be used to trigger an alarm or power converter fault for safe continued operation or shutdown. Conventional phase loss detection techniques, however, are generally either complicated and costly or unable to adequately detect all phase loss conditions. For instance, simple detection techniques have been proposed in which the difference between the DC bus voltage and the DC bus voltage squared is compared with a threshold, and if the threshold is exceeded, it is assumed that either excessive DC bus ripple is present or a phase loss has occurred. Other techniques involve detection of instantaneous DC bus voltage and comparing this to upper and lower limit boundaries, as well as calculating an average value of the ripple period in one sample cycle, but these techniques are prone to noise and suffer from low accuracy and slow response speed. Accordingly, improved techniques and apparatus are desirable for cost effective and robust detection of excessive ripple and phase loss in a power conversion system.

SUMMARY

Various aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter.

The present disclosure provides fast, accurate and robust techniques and apparatus to detect DC bus ripple and input phase loss according to one or more predetermined harmonics of the bus voltage relative to the AC input power fundamental frequency. These concepts can be employed for detection of input phase loss with respect to multiphase input systems, as well as for detecting excessive ripple content in both single phase and multiphase systems. In certain embodiments, as described herein, bandpass filters can be used as harmonic detectors to monitor and detect the amplitude of the sixth harmonic content in the DC bus voltage along with either or both of the second and fourth harmonics, with the phase loss and/or excess ripple conditions being detected based on one or more of these harmonics. The disclosed techniques can facilitate improved accuracy in phase loss and/or excess ripple detection and are robust and less prone to noise than prior approaches. Also, the disclosed detection apparatus provides fast, timely calculation of harmonic content and detection of adverse ripple and/or phase loss conditions, and may be implemented in hardware and/or processor-executed firmware or processor-executed software in a power converter controller with little or no added cost or complexity. Consequently, the disclosed techniques provide a significant advance over conventional approaches and find particular utility in association with low-cost motor drives and other power conversion systems in which ripple and phase loss detection is desired.

In accordance with one or more aspects of the present disclosure, a power conversion system is provided, which includes a detection system with a filter that provides an output signal or value representing an amplitude of a predetermined harmonic of a fundamental frequency of the AC input power in the DC bus voltage. The system further includes a logic circuit which detects excessive ripple on the DC bus and/or phase loss associated with the AC input power at least partially according to the filter output signal or value. In certain embodiments, the filter includes two or more bandpass filters individually providing an output signal or value representing the amplitude of a corresponding predetermined harmonic, and the logic detects ripple based on at least one of the filter output signals or values, and selectively detects phase loss based on the output of at least two of the bandpass filters.

In certain embodiments, first and second bandpass filters provide output signals or values representing the amplitudes of the second and sixth harmonics, respectively, with the logic selectively detecting excessive ripple at least partially according to the sixth harmonic amplitude, and selectively detecting phase loss according to the second and sixth harmonic amplitudes. In various implementations, phase loss detection is based on a ratio of the second harmonic to the sixth harmonic, with the logic providing a detection signal if the ratio exceeds a predetermined threshold. In certain embodiments, moreover, another bandpass filter is used to obtain the fourth harmonic, and a ratio of the fourth and sixth harmonics can also be compared with a threshold for selective identification of phase loss in the power converter. Also, or separately, the sixth harmonic can be compared with another threshold to selectively identify excessive DC bus voltage ripple conditions. Various implementations, moreover, can advantageously employ second order generalized integrator (SOGI) type bandpass filters, where the filter and logic in certain embodiments can be implemented using one or more programmable processors. Thus, cost-effective implementations are contemplated in which a power conversion system controller performs digital filtering computations to implement the bandpass filters based on sampled DC bus voltage signals or values, and further implements the threshold comparisons, whereby substantially no additional circuitry is needed to implement the ripple and phase loss features of the present disclosure.

Methods and programmed computer readable mediums are provided in accordance with further aspects of the disclosure for detecting phase loss and/or excessive ripple conditions in a power conversion system. The method includes sampling the DC bus voltage, and obtaining a sixth harmonic and at least one of the second and fourth harmonics in the sampled voltage, as well as detecting input phase loss if a ratio of one of the second harmonic and the fourth harmonic to the sixth harmonic exceeds a predetermined threshold.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Referring now to the figures, several embodiments or implementations are hereinafter described in conjunction with the drawings, wherein like reference numerals are used to refer to like elements throughout, and wherein the various features are not necessarily drawn to scale.

Methods and apparatus are disclosed for power converter ripple and phase loss detection in which one or more notch (bandpass) filters may be employed to check harmonic content in the DC bus voltage of a power converter for identifying phase loss and/or excessive ripple voltage, by which adverse effects on bus capacitors and other system components can be mitigated or avoided by selective triggering of system alarms and/or faults. The various concepts of the present disclosure are presented in the context of a motor drive type power conversion system 100, although the disclosed apparatus and techniques can be employed in any type of power conversion system using a DC bus. Moreover, the detection apparatus and methods may be implemented using hardware circuitry and/or may advantageously be embodied in programmable instructions stored in a power converter controller for execution by one or more processors in the conversion system. For instance, many motor drive systems include circuitry for sensing and sampling the DC bus voltage, for example, for closed loop control purposes, as well as programmable processing elements (e.g., microprocessors, microcontrollers, FPGAs, etc.) implementing various computational tasks associated with actuating inverter switching, communications, I/O functions and the like. The presently disclosed phase loss and ripple detection concepts can be implemented in such existing programmable processor(s) to utilize DC bus voltage sample values already available in the system, whereby no additional hardware may be required. In addition, the disclosed techniques provide fast, high accuracy, robust detection methods which are less prone to noise and simple to implement compared with conventional approaches. In certain implementations, for example, multiple harmonics can be detected by digital filtering techniques, with simplified tuning requiring only one parameter (e.g., frequency such as 50 Hz or 60 Hz), where as little as two second order generalized integrator (SOGI) notch filters can be used for timely accurate phase loss detection, by which processing overhead is minimal.

The inventors have appreciated that operation of a motor drive or other power converter by a balanced three-phase power supply typically results in the main harmonic component following rectification on the DC bus being the sixth order harmonic, relative to the frequency of the AC input power. For instance, using 60 Hz three-phase input power, the ripple voltage on the DC bus following a full bridge passive rectifier stage will be at 360 Hz (300 Hz harmonic for 50 Hz input power). Moreover, the inventors have appreciated that if one input phases lost, the dominant harmonics become the second and fourth order harmonics (e.g., 120 Hz and 240 Hz, respectively, for a 60 Hz input frequency). The present disclosure thus contemplates monitoring the second, fourth and sixth harmonics (or optionally just the sixth harmonic and one of the second and fourth harmonics) of the DC bus voltage for identification of excessive ripple and input phase loss.

Figure 1:
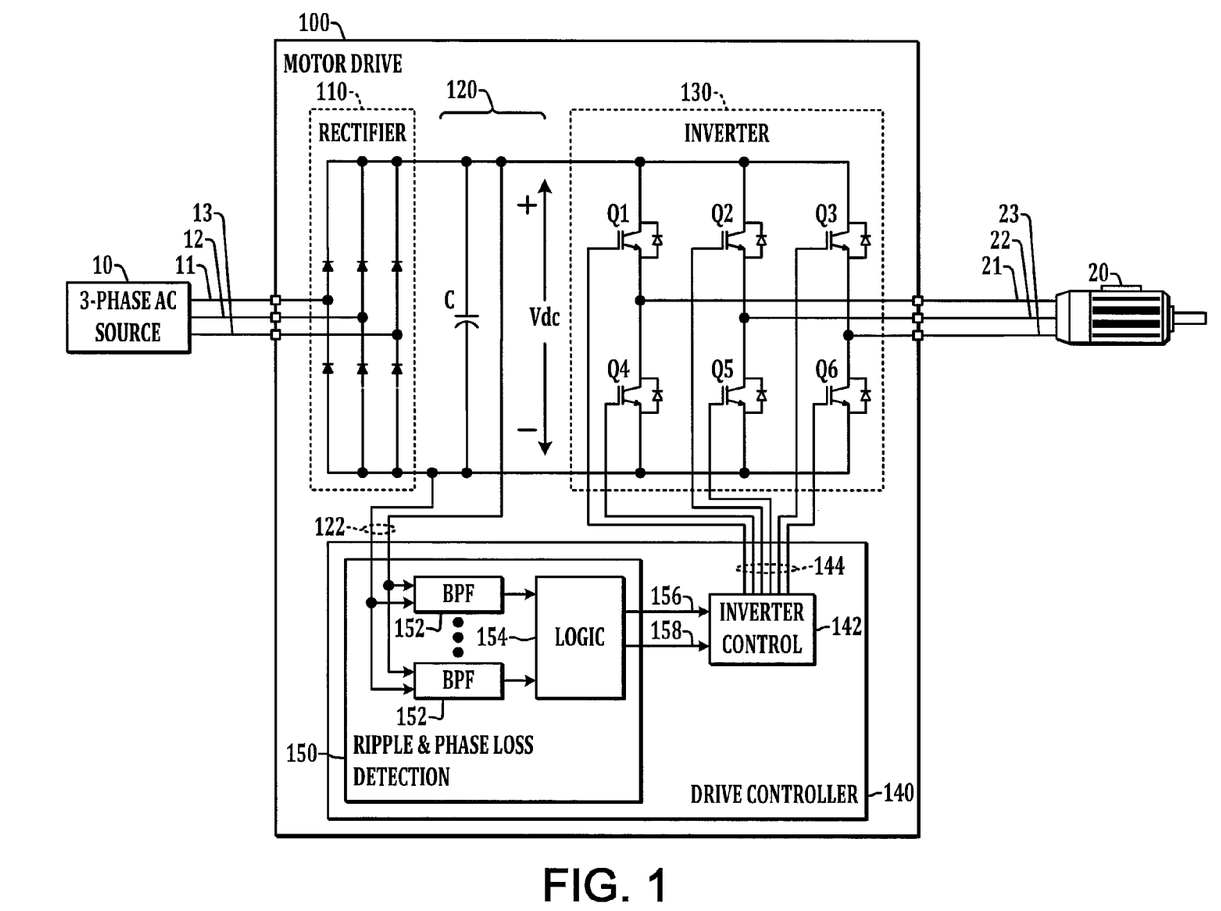
FIG. 1 is a simplified schematic diagram illustrating a motor drive power conversion system with a drive controller implementing a ripple and phase loss detection system using bandpass filters to identify predetermined harmonics of the voltage across the DC bus in accordance with one or more aspects of the present disclosure.

Referring initially to FIG. 1, a motor drive type power conversion system 100 is illustrated, including a six-device passive rectifier stage 110 receiving three-phase input power from a source 10 via leads 11, 12 and 13, where the rectifier 110 converts the AC input power to provide DC power to a DC bus 120. As shown in FIG. 1, the DC bus circuit 120 includes a bus capacitance C, which can be a single capacitor or multiple capacitors connected in any suitable series, parallel or combination series/parallel configuration. Operation of the rectifier 110 causes a DC bus voltage Vdc to be provided across the bus capacitance C, and this voltage is converted by an inverter 130 to generate one or more AC output signals to drive a load 20, such as a motor in the illustrated example, via output leads 21, 22 and 23. Although illustrated as driving a three phase motor load 20, any suitable inverter 130 can be used having single or multiphase outputs. As illustrated, the exemplary inverter 130 includes IGBT type switching devices Q1, Q2, Q3, Q4, Q5 and Q6 operable according to inverter switching control signals 144 from an inverter control component 142 of a drive controller 140. In addition, the drive controller 140 receives one or more signals or values 122 representing the DC bus voltage Vdc, for example, via one or more sensors as are known (not shown).

In accordance with the various aspects of the present disclosure, the drive controller 140 includes a ripple and phase loss detection system 150, including one or more bandpass filters (BPFs) 152 providing filter output signals or values to a logic circuit 154 representing the amplitude of a predetermined corresponding harmonic of a fundamental frequency of the AC input power in the DC bus voltage Vdc. The logic 154, in turn, selectively detects one or both of excessive ripple in the DC bus 120 and/or phase loss associated with the AC input power based at least partially on the filter output signal(s) or value(s). In one possible implementation, the bandpass filter or filters 152 can be hardware filters individually operative to receive an analog input signal 122 representing the DC bus voltage Vdc, and to provide a filter output signal indicative of the amplitude of a predetermined harmonic of the fundamental frequency. In such embodiments, for instance, the logic circuit 154 may be dedicated hardware logic operative to assess phase loss and/or excessive ripple based on the filter output signal(s) from the filter(s) 152.

In alternate implementations, the logic 154 may be implemented via a programmable processor element, such as a microprocessor, microcontroller, etc., based on analog to digital conversion of analog filter output signals from the bandpass filter(s) 152. In still other possible embodiments, the entire ripple and phase loss detection system 150 can be implemented using at least one digital processor programmed using suitable computer executable instructions to implement bandpass filters 152 by digital filtering techniques as are known based on sampled (analog to digital converted) DC bus voltage values and to provide filter output values representing the amplitude of the corresponding harmonic content of the sampled DC bus voltage values, as well as to implement the logic 154 to selectively provide an excess ripple output signal or value 156 and/or a phase loss detection output signal or value 158 based on the filter outputs.

As seen in FIG. 1, moreover, the detector output signals or values 156 and 158 may be provided to the inverter controller 142 for use thereby, such as to safely shutdown operation of the inverter upon detection of one or both of these conditions, and the detection outputs 156, 158 may also be used by other supervisory control components of the power conversion system 100 and/or may be communicated to external devices for appropriate action. Moreover, the logic 154 and/or the drive controller 140 generally may be configured or programmed to take user-configurable actions based on detection of excessive ripple voltage 156 or phase loss 158. In this regard, the system 100 may be configured to selectively initiate an alarm based on one or both of the conditions 156, 158 and/or to initiate a fault condition, for example, to begin one or more safe shut down operations, instigate remedial actions, send warning messages, etc.

Figure 2:
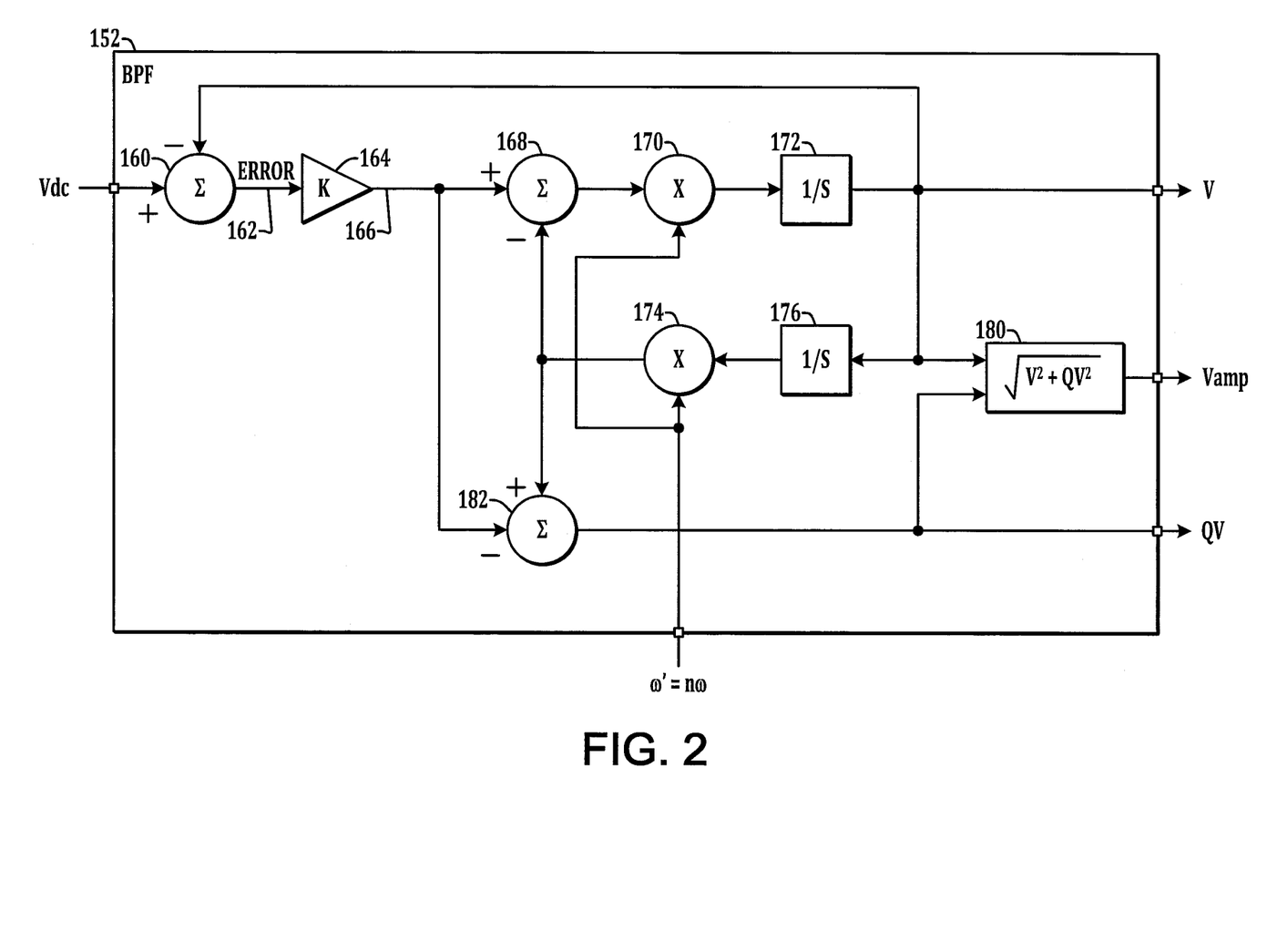
FIG. 2 is a schematic diagram illustrating an exemplary second order generalized integrator type bandpass filter in the detection system of FIG. 1.

Referring also to FIG. 2, an exemplary second order generalized integrator (SOGI) bandpass filter 152 is illustrated, including an input to receive the DC bus voltage signal or value Vdc, as well as outputs V, Vamp and QV. Although a second order bandpass filter 152 is illustrated, any suitable second or higher order bandpass or notch filter can be used which provides a lower cut in frequency and a higher cut out frequency to implement bandpass filtering as are known. As previously noted, the bandpass filter 152 may be implemented via programming instructions by a system processor, and the indicated components in FIG. 2 may each be implemented in processor-executed software or processor-executed firmware in certain implementations. Among the functional components in the bandpass filter 152 of FIG. 2 are summation functions 160, 168 and 182, a gain function 164, multiplier functions 170 and 174, as well as integrator functions 172 and 176 (shown as 1/S blocks in the figure). In addition, the block 180 in FIG. 2 provides a square root of the sum of squares operation with respect to the quadrature output values V and QV to generate the amplitude output Vamp.

As seen in FIG. 2, the DC bus voltage input Vdc is received by the initial summing junction 160 of the filter 152, and the output value V is subtracted therefrom to generate an error signal or value 162. The error 162 is multiplied by a gain value K via a gain function 164 to provide an adjusted error value 166. A feedback value from a multiplier 174 is subtracted from the adjusted error value 166 via a summer 168 whose output is provided to a multiplier 170 for multiplication by a harmonic frequency value $\omega'=n\omega$, where $\omega$ is the frequency of power supply and n is the harmonic order of interest. For example, the fundamental power supply frequency may be 60 Hz in one example, and a particular bandpass filter 152 may be tuned with respect to a predetermined harmonic thereof, for example the second harmonic (e.g., 120 Hz, n=2), the fourth harmonic (e.g., 240 Hz, n=4) or the sixth harmonic (e.g., 360 Hz, n=6) in various exemplary embodiments. The output of the multiplier 170 is integrated by a 1/S function 172 to provide the output V. This output V is also provided as an input to a second integrator function 176 whose output is multiplied by $\omega'$ using another multiplier function 174. The output of the second multiplier 174 is subtracted from the adjusted error signal or value 166 via the summer 168 as described above, and the adjusted error is subtracted from the output of the multiplier 174 via another summation function 182 in order to provide the quadrature output Qv. In addition, the square root of the sum of squares function 180 provides the amplitude output as the square root of the sum of the squares of the quadrature V and QV values.

The bandpass filter 152 in this embodiment thus provides three outputs including quadrature signals V and QV, and the Vamp output representing the amplitude of nth order harmonic relative to the input frequency value $\omega$. As seen, the exemplary SOGI filter 152 is relatively simple to implement in hardware or using digital filtering techniques in a programmed processor, and only includes two integrators 172 and 176 along with one parameter K. The output signals V and QV are defined by the transfer functions shown in the following equations (1) and (2):

$$D(s) = \frac{V}{Vdc} = \frac{K\omega's}{s^2 + K\omega's + \omega'^2}, \text{ and} \quad (1)$$

$$Q(s) = \frac{QV}{Vdc} = \frac{K\omega'^2 - K^2\omega's}{s^2 + K\omega's + \omega'^2}, \text{ where} \quad (2)$$

V and QV have both a gain of zero at frequency of $\omega'$, but have the phase delay of 0 and 90 degrees respectively. Also, the exemplary filter 152 removes the DC component of Vdc due to large negative gain of V and QV at low frequency. Moreover, because V and QV are quadrature signals at frequency $\omega'$, the amplitude of harmonics at that frequency $\omega'$ can be easily computed via the amplitude function 180 according to the following equation (3):

$$Vamp = (V^2 + QV^2)^{1/2} \quad (3)$$

Figure 3:
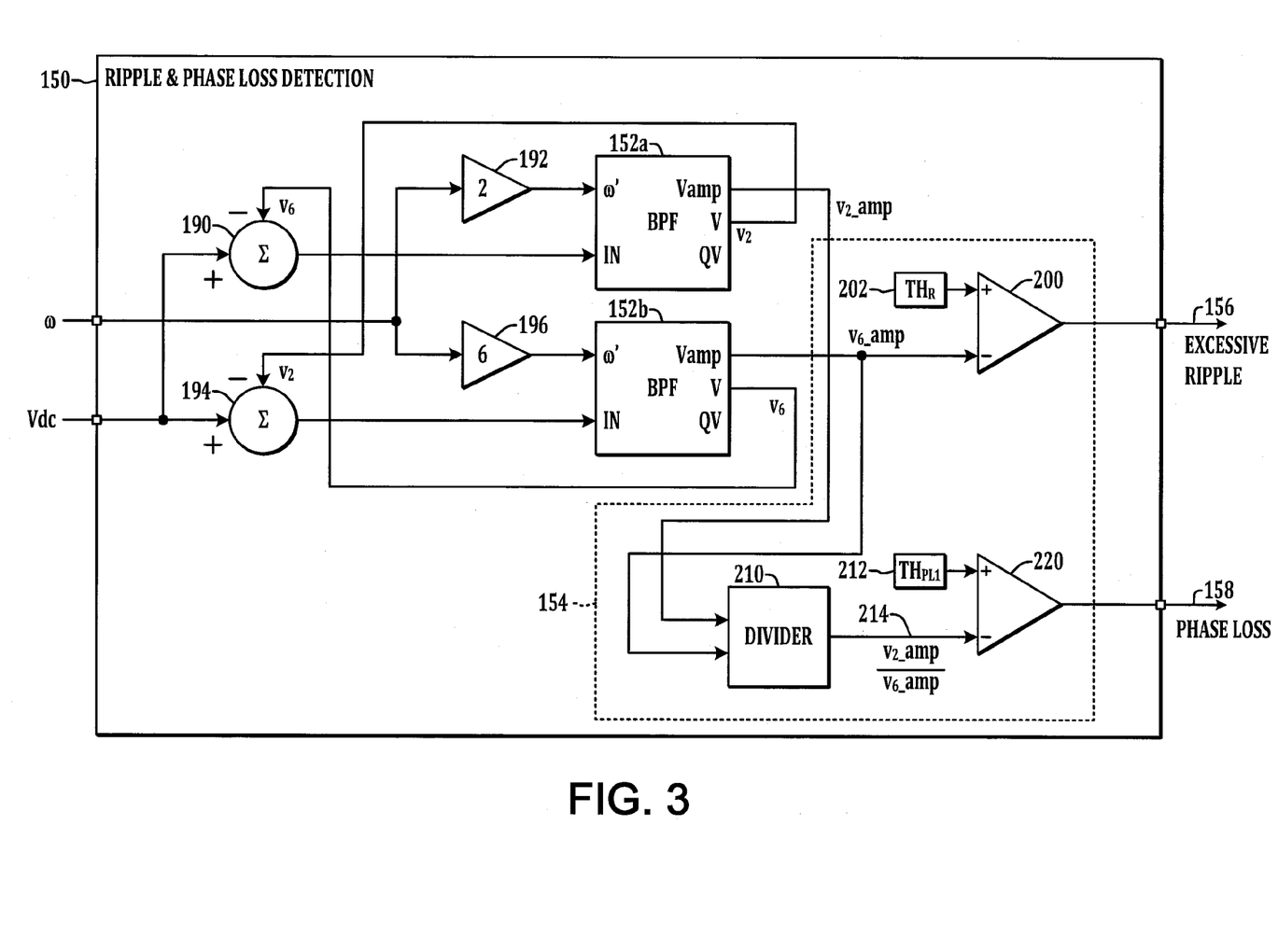
FIG. 3 is a schematic diagram illustrating a detection system embodiment using two bandpass filters to identify second and sixth order harmonics in the DC bus voltage for detecting excessive ripple and/or phase loss in the system of FIG. 1.
Figure 4:
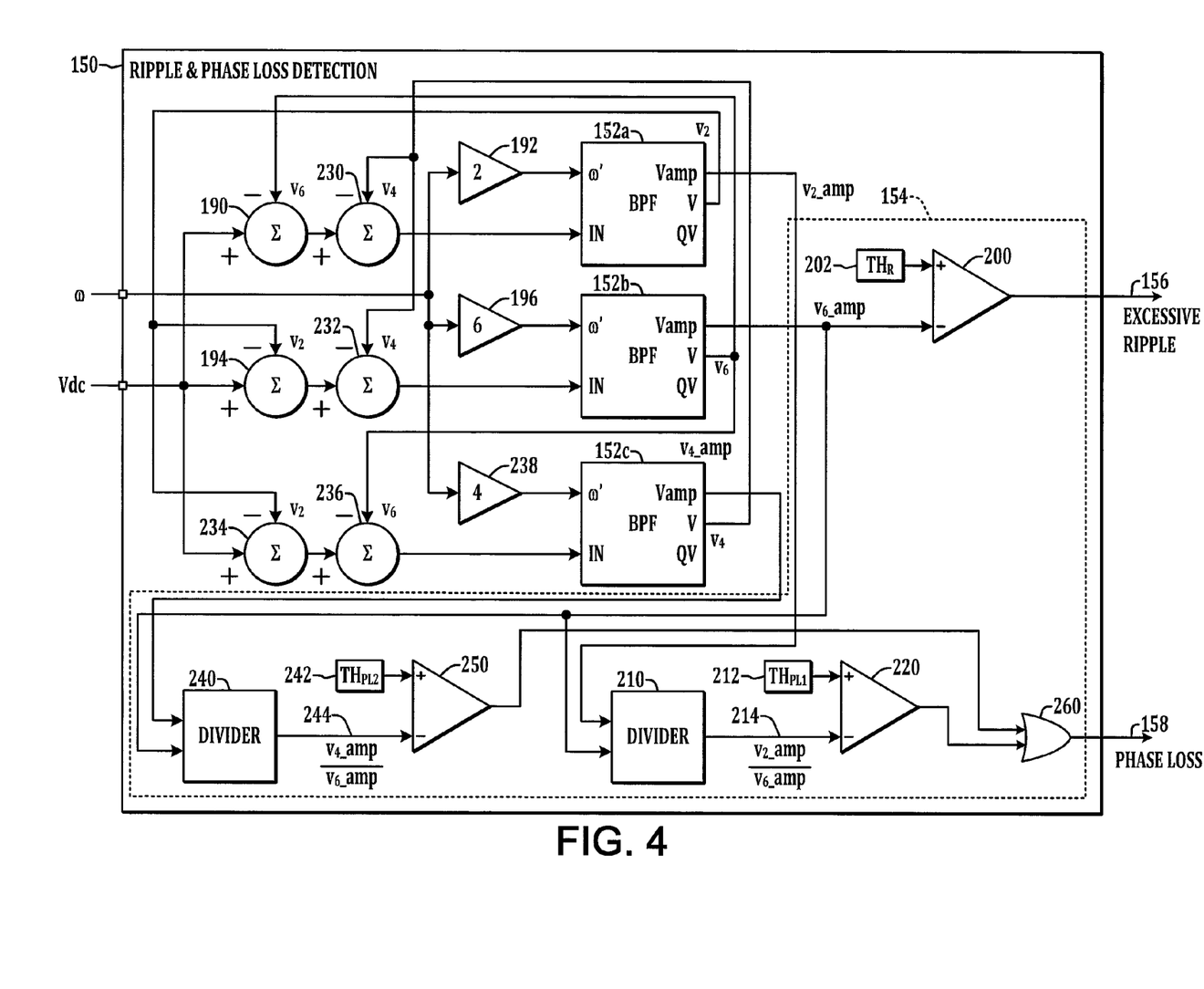
FIG. 4 is a schematic diagram illustrating another detection system embodiment using three bandpass filters to obtain second, fourth and sixth harmonics of the DC bus voltage to detect excessive ripple and/or phase loss.

Referring now to FIGS. 3 and 4, two exemplary embodiments of a ripple/phase loss detection system 150 are illustrated, in which multiple harmonics can be detected using multiple filters 152 as exemplified in FIG. 2. The example of FIG. 3 uses bandpass filters 152a and 152b to identify second and sixth order harmonics, respectively, in the DC bus voltage Vdc for detecting excessive ripple and/or phase loss in the power conversion system 100. FIG. 4 shows another embodiment using three bandpass filters 152a, 152b and 152c to obtain second, fourth and sixth harmonics of Vdc for excessive ripple and/or phase loss detection. In these embodiments, the amplitude outputs from the bandpass filters 152 are V2_amp, V4_amp, and V6_amp which represent or otherwise indicate the detected second, fourth and sixth order harmonic amplitudes, wherein the fourth order harmonic detector is optional as seen in FIG. 3.

As noted above, each of the filters 152 receives a frequency input $\omega'$ which is a multiple of the power supply fundamental frequency $\omega$, and also includes an input terminal (indicated as IN in FIGS. 3 and 4), where the illustrated examples optionally employ summation blocks to selectively remove the other computed harmonics from the sampled DC bus voltage input Vdc. Thus, for example, the system 150 of FIG. 3 includes a summer 190 that provides an input to a first bandpass filter 152a by subtracting the sixth order harmonic output $v_6$ of the other filter 152b from the bus voltage signal or value Vdc. Likewise, a summation function 194 is used to subtract the second order filter output $v_2$ of the bandpass filter 152a from the bus voltage Vdc for providing the input to the sixth order harmonic bandpass filter 152b. The input to each harmonic detector or bandpass filter 152 is therefore substantially Vdc after removing of other in-line harmonic signals, which are output from other harmonic detectors 152, although the summation functions 190 and 194 may be omitted in certain embodiments. In addition, the detection system 150 in FIG. 3 includes integer multipliers 192 (n=2) and 196 (n=6) that operate to respectively set the frequency inputs ω' to the second and sixth order bandpass filters 152a and 152b to the respective second and sixth order harmonics of the fundamental frequency ω.

In the example of FIG. 3, the logic circuit 150 implements a comparator 200 that compares the amplitude of the sixth order harmonic $v_{6\_amp}$ with a threshold value 202 (THR), and generates an active high Boolean output signal to indicate excessive ripple voltage on the DC bus 120 if the amplitude $v_{6\_amp}$ of the sixth order harmonic exceeds the threshold 202. In practice, the threshold value 202 can be set to any suitable value by which normal sixth order ripple content on the DC bus 120 can be differentiated from excessive or abnormal amounts of ripple. In this regard, the inventors have appreciated that use of passive full bridge three-phase rectifiers 110, such as are common in low-cost power conversion systems 100, will lead to normal or nominal values of sixth order harmonic content of the DC voltage Vdc, and that a threshold value 202 can be set higher than this normal operating level, while low enough to detect increases in the ripple prior to adverse effects on the bus capacitor C (FIG. 1).

In addition, the logic circuit 154 of FIG. 3 includes a divider circuit 210 providing an output 214 representing the value of the ratio of the second order harmonic amplitude to the sixth order harmonic amplitude ($v_{2\_amp}/v_{6\_amp}$). The ratio value 214 is compared with a first phase loss threshold value 212 ($TH_{PL1}$), and a comparator 220 generates an active high phase loss output signal or value 158 when the ratio of the second and sixth order harmonics 214 exceeds the threshold value 212. The inventors have appreciated that the occurrence of an input phase loss condition will result in increase in the second and/or fourth order harmonic content of the DC bus voltage Vdc, and may also result in a decrease in the amplitude of the sixth order DC bus voltage harmonic content. Accordingly, the illustrated embodiment advantageously computes or otherwise generates a ratio signal or value 214 which will increase upon occurrence of a phase loss condition. In practice, the first phase loss threshold value 212 can be set such that the ratio value 214 will nominally be below the threshold 212 during normal operation, and the threshold value 212 is preferably set low enough that the ratio value 214 will exceed the threshold value 212 upon the occurrence of a phase loss at the AC input.

FIG. 4 illustrates another embodiment employing three bandpass filters 152a (generating an output signal indicating the amplitude of the second order harmonic), 152b (for the sixth harmonic), and a third bandpass filter 152c providing an amplitude output ($v_{4\_amp}$) representing the amplitude of the fourth order harmonic of the DC bus voltage Vdc. In the illustrated implementation, a pair of summing junctions are provided between the IN inputs of the respective bandpass filters 152 and the sampled DC voltage value Vdc in order to subtract out the other two in-line harmonics being computed. For instance, the input IN to the second order bandpass filter 152a is provided from summers 190 and 230 which successively subtract the sixth order and fourth order harmonic outputs $v_6$ and $v_4$ from the other bandpass filters 152b and 152c, respectively. Similarly, the input IN to the second bandpass filter 152b for generating the sixth order harmonic output value) is provided through summers 194 and 232 to subtract off the second and fourth order harmonics, and the input to the third bandpass filter 152c is provided through summers 234 and 236 which respectively subtract the second and sixth order harmonic values $v_2$ and $v_6$. In addition, the third bandpass filter 152c is set to provide the fourth order harmonic amplitude signal or value $v_{4\_amp}$ by using a multiplier 238 (n=4) to provide the ω' input at the fourth harmonic of the fundamental frequency ω (e.g., at 240 Hz for a 60 Hz fundamental frequency).

In this example, like that of FIG. 3 above, the logic circuit 154 includes a comparator 200 which compares the sixth the order harmonic amplitude value $v_{6\_amp}$ to the threshold value THR 202, and selectively actuates the ripple detection output 156 if the sixth harmonic $v_{6\_amp}$ exceeds the threshold 202. In this case, however, the phase loss detection output 158 is selectively activated by one or both of two conditions via an OR gate 260. In particular, the phase loss output signal 158 is generated if the ratio 214 of the second and sixth order harmonic amplitudes exceeds the first predetermined threshold value 212 ($TH_{PL1}$) or if a ratio 244 of the fourth and sixth order harmonic values exceeds a second predetermined threshold value 242 ($TH_{PL2}$). In this implementation, therefore, the logic circuit 154 implements a second divider function 240 computing or otherwise generating the ratio 244 of the fourth and sixth order harmonic amplitude signals or values, as well as a comparator 250 providing an active high output signal to the output OR gate 260 if the ratio of the fourth and sixth harmonics exceeds a threshold $TH_{PL2}$ 242.

Figure 5:
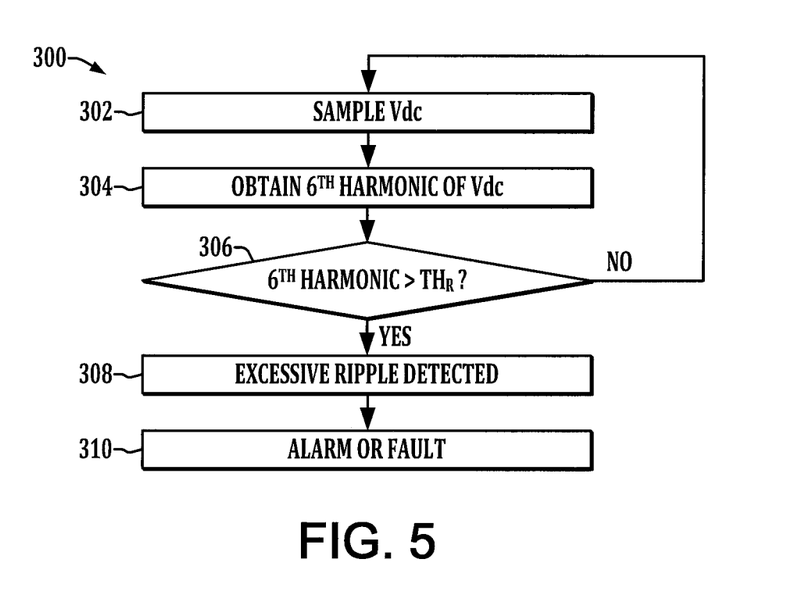
FIG. 5 is a flow diagram illustrating an exemplary method or process for detecting excessive ripple in a power conversion system.
Figure 6:
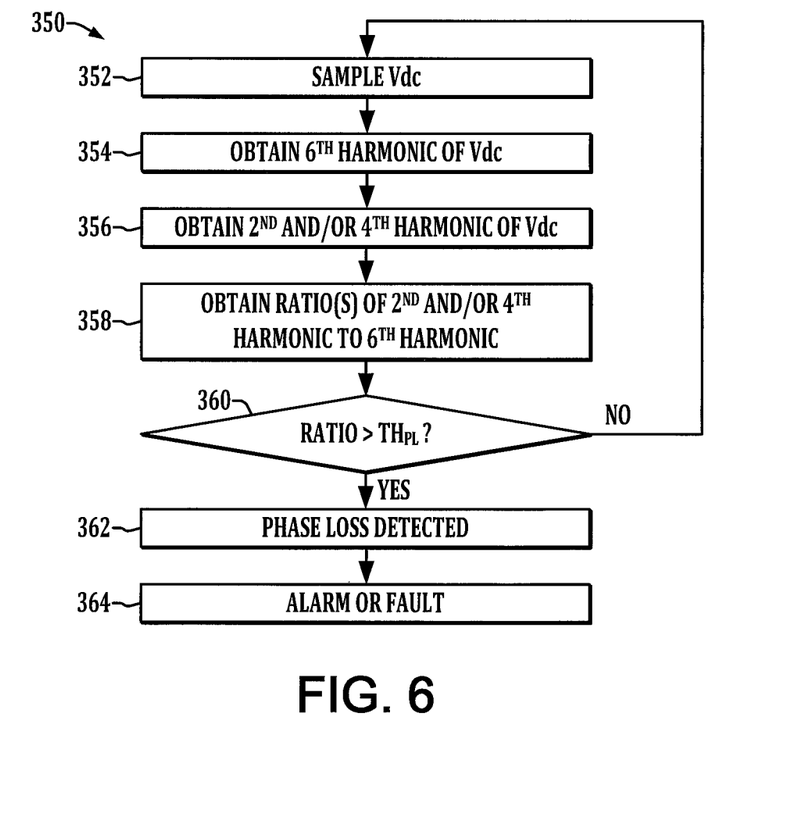
FIG. 6 is a flow diagram illustrating an exemplary method or process for detecting phase loss in a power conversion system.

Referring also to FIGS. 5 and 6, methods 300 and 350 are provided for detecting excessive DC bus voltage ripple and/or AC input phase loss in accordance with further aspects of the disclosure. Although the exemplary methods are depicted and described in the form of a series of acts or events, it will be appreciated that the various methods of the disclosure are not limited by the illustrated ordering of such acts or events except as specifically set forth herein. In this regard, except as specifically provided hereinafter, some acts or events may occur in different order and/or concurrently with other acts or events apart from those illustrated and described herein, and not all illustrated steps may be required to implement a process or method in accordance with the present disclosure. The illustrated methods may be implemented in hardware, processor-executed software, or combinations thereof, in order to provide ripple detection and/or phase loss detection and power conversion circuits, and may be implemented in a power converter and/or in a separate device. For instance, these techniques may be employed in power converters 100 including motor drives such as those illustrated and described herein, although the present disclosure is not limited to the specifically illustrated or described applications and systems.

FIG. 5 illustrates a method 300 for detecting excessive ripple in a DC bus voltage of a power conversion system (e.g., motor drive 100 above). The method 300 begins at 302, where a DC voltage (e.g., Vdc) is sampled, and a sixth order harmonic of the sample voltage is obtained at 304. At 306, a determination is made as to whether the sixth order harmonic of the DC bus voltage is greater than a ripple threshold value (e.g., $TH_R$ 202 above). If not (NO at 306), the DC bus voltage is again sampled at 302 and the process continues as described above. If the sixth order harmonic exceeds the threshold (YES at 306), excess ripple is detected at 308 (e.g., the ripple detection output 156 in FIGS. 3 and 4 above is actuated), and one or more alarms are faults may be initiated at 310.

FIG. 6 illustrates a method 350 for selectively detecting AC input phase loss in a power conversion system, where a DC bus voltage of the power converter is sampled at 352. At 354, the sixth order harmonic of the sample DC bus voltage is obtained, and a second (and optionally a fourth) order harmonic thereof is obtained at 356. At 358, one or more ratios are obtained indicating the ratio of the second order harmonic to the sixth order harmonic and optionally the ratio of the fourth order harmonic to the sixth order harmonic, and a determination is made at 360 as to whether one or both of the ratios exceeds a threshold (e.g., $TH_{PL1}$ or $TH_{PL2}$ above). If not (NO at 360), the process repeats at 352-360. If either of the ratios exceeds the threshold (YES at 360), an input phase loss occurrence is detected at 362 (e.g., phase loss detection output 158 above), and one or more alarms or faults are initiated at 364.

In accordance with further aspects of the present disclosure, a non-transitory computer readable medium is provided, such as a computer memory, a memory within a power converter control system (e.g., controller 100), a CD-ROM, floppy disk, flash drive, database, server, computer, etc.), which includes computer executable instructions for performing the above-described methods. The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. A power conversion system, comprising:
   a rectifier operative to convert AC input power to provide DC power to a DC bus;
   an inverter operative to generate at least one AC output signal to drive a load using power from the DC bus; and
   a detection system comprising:
      a filter operative to provide a filter output signal or value representing an amplitude of a predetermined harmonic of a fundamental frequency of the AC input power in a voltage of the DC bus, the filter comprising:
         a first bandpass filter operative to provide a first filter output signal or value representing an amplitude of a second harmonic of the fundamental frequency of the AC input power in the voltage of the DC bus, and
         a second bandpass filter operative to provide a second filter output signal or value representing an amplitude of a sixth harmonic of the fundamental frequency of the AC input power in the voltage of the DC bus, and
      a logic circuit operative to selectively detect at least one of excessive ripple on the DC bus and phase loss associated with the AC input power based at least partially on the filter output signal or value, the logic circuit being operative to:
         selectively detect excessive ripple on the DC bus if the second filter output signal or value exceeds a predetermined ripple threshold, and
         selectively detect phase loss associated with the AC input power if a ratio of the first filter output signal or value to the second filter output signal or value exceeds a first predetermined threshold.

2. A power conversion system, comprising:
   a rectifier operative to convert AC input power to provide DC power to a DC bus;
   an inverter operative to generate at least one AC output signal to drive a load using power from the DC bus; and
   a detection system comprising:
      a filter operative to provide a filter output signal or value representing an amplitude of a predetermined harmonic of a fundamental frequency of the AC input power in a voltage of the DC bus, and
      a logic circuit operative to selectively detect at least one of excessive ripple on the DC bus and phase loss associated with the AC input power based at least partially on the filter output signal or value,
   wherein the filter comprises a plurality of bandpass filters individually operative to provide a filter output signal or value representing an amplitude of a corresponding predetermined harmonic of the fundamental frequency of the AC input power in the voltage of the DC bus;
   wherein the logic circuit is operative to selectively detect excessive ripple on the DC bus based at least partially on the filter output signal or value from one of the bandpass filters, and to selectively detect phase loss associated with the AC input power based at least partially on filter output signals or values from at least two of the bandpass filters; and
   wherein the bandpass filters are second order generalized integrators.

3. The power conversion system of claim 2:
   wherein the filter comprises:
      a first bandpass filter operative to provide a first filter output signal or value representing an amplitude of a second harmonic of the fundamental frequency of the AC input power in the voltage of the DC bus, and
      a second bandpass filter operative to provide a second filter output signal or value representing an amplitude of a sixth harmonic of the fundamental frequency of the AC input power in the voltage of the DC bus; and
   wherein the logic circuit is operative to:
      selectively detect excessive ripple on the DC bus based at least partially on the second filter output signal or value, and to
      selectively detect phase loss associated with the AC input power based at least partially on the first and second filter output signals or values.

4. The power conversion system of claim 3, wherein the logic circuit is operative to selectively detect phase loss associated with the AC input power if a ratio of the first filter output signal or value to the second filter output signal or value exceeds a first predetermined threshold.

5. The power conversion system of claim 4:
wherein the filter comprises a third bandpass filter operative to provide a third filter output signal or value representing an amplitude of a fourth harmonic of the fundamental frequency of the AC input power in the voltage of the DC bus; and
wherein the logic circuit is operative to detect phase loss associated with the AC input power if the ratio of the first filter output signal or value to the second filter output signal or value exceeds the first predetermined threshold or if a ratio of the third filter output signal or value to the second filter output signal or value exceeds a second predetermined threshold.

6. The power conversion system of claim 5, wherein the logic circuit is operative to detect excessive ripple on the DC bus if the second filter output signal or value exceeds a third predetermined threshold.

7. The power conversion system of claim 3:
wherein the filter comprises a third bandpass filter operative to provide a third filter output signal or value representing an amplitude of a fourth harmonic of the fundamental frequency of the AC input power in the voltage of the DC bus; and
wherein the logic circuit is operative to detect phase loss associated with the AC input power if a ratio of the first filter output signal or value to the second filter output signal or value exceeds a first predetermined threshold or if a ratio of the third filter output signal or value to the second filter output signal or value exceeds a second predetermined threshold.

8. The power conversion system of claim 7, wherein the logic circuit is operative to detect excessive ripple on the DC bus if the second filter output signal or value exceeds a third predetermined threshold.

9. The power conversion system of claim 1:
wherein the filter comprises a third bandpass filter operative to provide a third filter output signal or value representing an amplitude of a fourth harmonic of the fundamental frequency of the AC input power in the voltage of the DC bus; and
wherein the logic circuit is operative to detect phase loss associated with the AC input power if the ratio of the first filter output signal or value to the second filter output signal or value exceeds the first predetermined threshold or if a ratio of the third filter output signal or value to the second filter output signal or value exceeds a second predetermined threshold.

10. The power conversion system of claim 9, wherein the logic circuit is operative to detect excessive ripple on the DC bus if the second filter output signal or value exceeds a third predetermined threshold.

11. The power conversion system of claim 1, wherein the filter and the logic circuit are implemented in at least one programmed processor.

12. A method for detecting phase loss associated with AC input power to a power conversion system, the method comprising:
sampling a voltage of a DC bus of the power conversion system;
obtaining a sixth harmonic of a fundamental frequency of the AC input power in the sampled voltage of the DC bus;
obtaining at least one of a second harmonic and a fourth harmonic of the fundamental frequency of the AC input power in the sampled voltage of the DC bus;
obtaining a ratio of one of the second harmonic and the fourth harmonic to the sixth harmonic; and
detecting phase loss associated with the AC input power if the ratio exceeds a predetermined threshold.

13. The method of claim 12, comprising:
obtaining a first ratio of the second harmonic to the sixth harmonic;
obtaining a second ratio of the fourth harmonic to the sixth harmonic;
comparing the first ratio to a first predetermined threshold;
comparing the second ratio to a second predetermined threshold; and
detecting phase loss associated with the AC input power if the first ratio exceeds the first predetermined threshold or if the second ratio exceeds the second predetermined threshold.

14. The method of claim 13, comprising:
comparing the sixth harmonic to a third predetermined threshold; and
detecting excessive ripple in the voltage of a DC bus if the sixth harmonic exceeds the third predetermined threshold.

15. A non-transitory computer readable medium with computer executable instructions for detecting phase loss associated with AC input power to a power conversion system, the computer readable medium comprising computer executable instructions for:
sampling a voltage of a DC bus of the power conversion system;
obtaining a sixth harmonic of a fundamental frequency of the AC input power in the sampled voltage of the DC bus;
obtaining at least one of a second harmonic and a fourth harmonic of the fundamental frequency of the AC input power in the sampled voltage of the DC bus;
obtaining a ratio of one of the second harmonic and the fourth harmonic to the sixth harmonic; and
detecting phase loss associated with the AC input power if the ratio exceeds a predetermined threshold.

16. The computer readable medium of claim 15, comprising computer executable instructions for:
obtaining a first ratio of the second harmonic to the sixth harmonic;
obtaining a second ratio of the fourth harmonic to the sixth harmonic;
comparing the first ratio to a first predetermined threshold;
comparing the second ratio to a second predetermined threshold; and
detecting phase loss associated with the AC input power if the first ratio exceeds the first predetermined threshold or if the second ratio exceeds the second predetermined threshold;
comparing the sixth harmonic to a third predetermined threshold; and
detecting excessive ripple in the voltage of a DC bus if the sixth harmonic exceeds the third predetermined threshold.

17. The power conversion system of claim 2, wherein the filter and the logic circuit are implemented in at least one programmed processor.

18. The power conversion system of claim 10, wherein the filter and the logic circuit are implemented in at least one programmed processor.

19. The power conversion system of claim 9, wherein the filter and the logic circuit are implemented in at least one programmed processor.

\* \* \* \* \*